United States Patent
Lee et al.

(10) Patent No.: US 10,467,358 B2
(45) Date of Patent: Nov. 5, 2019

(54) SIMULATION APPARATUS AND OPERATING METHOD THEREOF

(71) Applicant: LSIS CO., LTD., Anyang-si, Gyeonggi-do (KR)

(72) Inventors: Myung Hwan Lee, Anyang-si (KR); Young In Kim, Anyang-si (KR); Hong Joo Kim, Anyang-si (KR); Chong Suk Song, Anyang-si (KR)

(73) Assignee: LSIS CO., LTD., Anyang-si, Gyeonggi-do (KR)

( * ) Notice: Subject to any disclaimer, the term of this patent is extended or adjusted under 35 U.S.C. 154(b) by 303 days.

(21) Appl. No.: 15/610,469

(22) Filed: May 31, 2017

(65) Prior Publication Data

US 2017/0351792 A1 Dec. 7, 2017

(30) Foreign Application Priority Data

Jun. 1, 2016 (KR) .................. 10-2016-0068037

(51) Int. Cl.
*G06F 17/50* (2006.01)
*G06G 7/54* (2006.01)
*G06F 11/07* (2006.01)

(52) U.S. Cl.
CPC ........ *G06F 17/5009* (2013.01); *G06F 11/073* (2013.01); *G06F 11/079* (2013.01); *G06F 11/0751* (2013.01); *G06F 11/0772* (2013.01)

(58) Field of Classification Search
CPC .............. G06F 17/5009; G06F 11/073; G06F 11/0751; G06F 11/0772; G06F 11/079
USPC .......................................................... 703/14
See application file for complete search history.

(56) References Cited

U.S. PATENT DOCUMENTS

| 8,063,713 B2 * | 11/2011 | Cheng | ................. | H01L 23/5228 333/4 |
| 8,225,144 B2 | 7/2012 | Kato | | |
| 2010/0179704 A1 * | 7/2010 | Ozog | ............... | G06Q 10/06315 700/291 |

(Continued)

FOREIGN PATENT DOCUMENTS

| JP | 2012108085 | 6/2012 |
| JP | 2013182468 | 9/2013 |
| JP | 2013542433 | 11/2013 |

(Continued)

OTHER PUBLICATIONS

European Search Report for related European Application No. 17171971.9; report dated Oct. 27, 2017; (8 pages).

(Continued)

*Primary Examiner* — Andre Pierre Louis
(74) *Attorney, Agent, or Firm* — K&L Gates LLP

(57) ABSTRACT

A simulation apparatus includes a database configured to a set line parameter for a system line configuring a power system; a parameter error detector configured to compare surveyed data measured in the system line and the line parameter to detect error of the line parameter; a system analysis simulator configured to perform a system analysis simulation based on the surveyed data and the line parameter; and a monitor configured to display an error detection result of the line parameter from the parameter error detector and a system analysis simulation result performed in the system analysis simulator.

10 Claims, 2 Drawing Sheets

(56) References Cited

U.S. PATENT DOCUMENTS

2012/0191439 A1* 7/2012 Meagher ............. G06F 17/5009
703/18
2016/0118878 A1* 4/2016 Alteneiji ............... H02J 3/1821
323/205

FOREIGN PATENT DOCUMENTS

| KR | 20050055729 | 6/2005 |
| KR | 20150108264 | 9/2015 |

OTHER PUBLICATIONS

Bam L et al; "Review: power system analysis software tools"; Power Engineering Society General Meeting; IEEE; San Francisco, CA; Jun. 12-16, 2005; pp. 146-151; (6 pages).

* cited by examiner

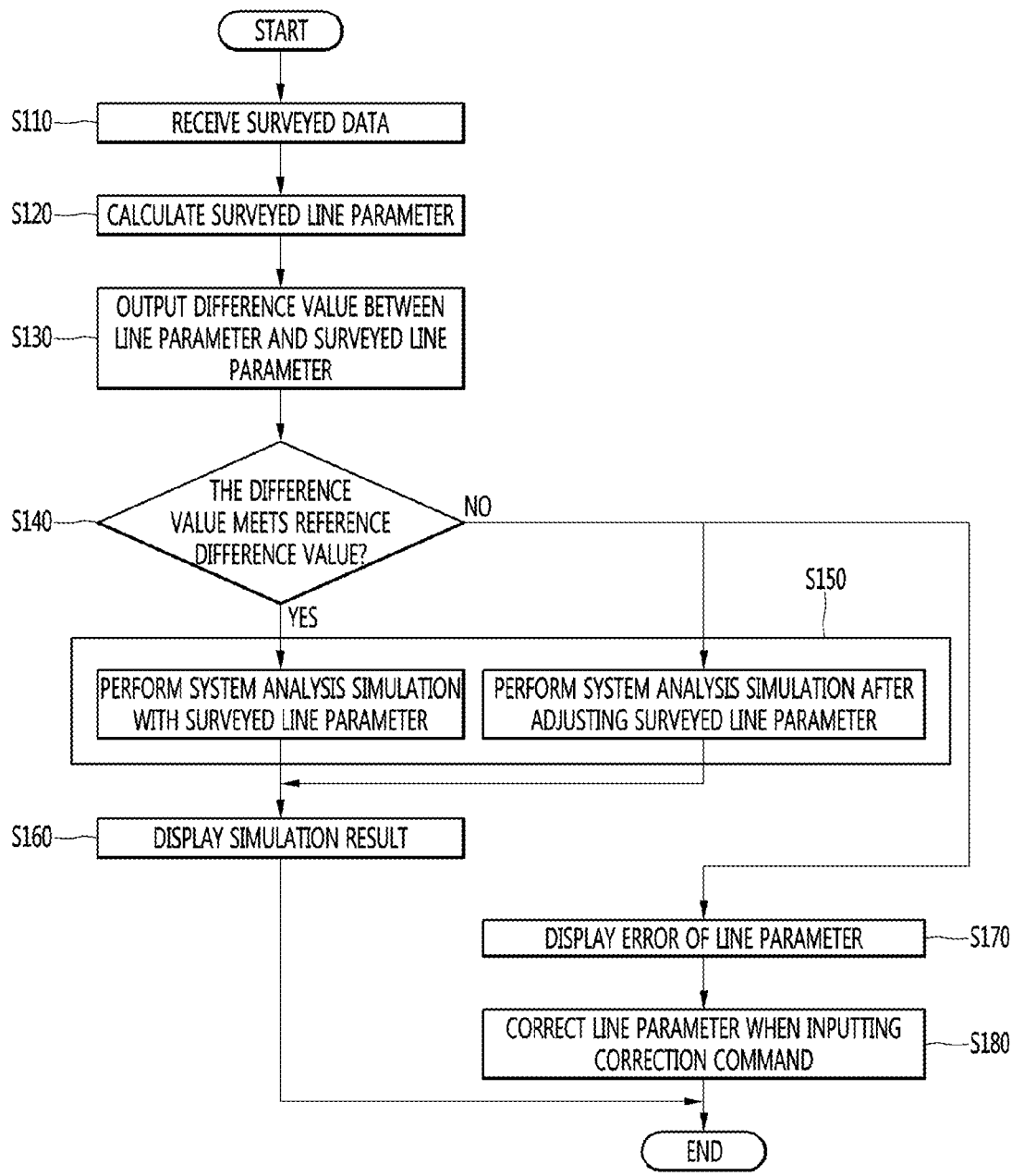

SIMULATION APPARATUS AND OPERATING METHOD THEREOF

CROSS-REFERENCE TO RELATED APPLICATIONS

Pursuant to 35 U.S.C. § 119(a), this application claims the benefit of earlier filing date and right of priority to Korean Patent Application No. 10-2016-0068037 filed on Jun. 1, 2016, the contents of which are hereby incorporated by reference herein its entirety.

BACKGROUND

The present invention relates a simulation apparatus and operating method thereof. And, more specifically, the present invention relates to a simulation apparatus and operating method thereof, capable of comparing surveyed data of a system line and a set line parameter before performing a system analysis simulation, detecting whether the line parameter is erroneous.

Power transmission facilities continue to expand with rapid increase of power demand, and power system management tasks become complicated more and more with complicated connection of power transmission system network and various topologies in substations.

Further, there is an increased demand for a stable power supply, and a higher risk for occurrence of an unstable power system, such as power collapse and generation drop, due to complicated power supply and increased demand. Accordingly, an energy management system to monitor and control the power system may be used, which is the highest system of the power system.

Data processed in the energy management system (EMS) may be generally classified into two types.

There are static data that are not changed after being inputted by a user and dynamic data that are measured in real time to be transferred.

The static data may be facility characteristics such as a line parameter and a generator parameter, and the dynamic data may be data that are changed in real time, such as voltage and current. The EMS performs a system analysis simulation with those data as input.

A system analysis simulation program adjusts dynamic data obtained in real time and displays the result to a user, on the assumption that the static data are correct.

Accordingly, although the data obtained in real time include noises, the system analysis simulation program may adjust the dynamic data.

Recently, in case that the static data are not correct, the system analysis simulation program may use the static data as they are, so that it may display an incorrect result or generate errors. Therefore, a study to prevent it is on the way.

SUMMARY

Provided in this disclosure is a simulation apparatus and operating method thereof, capable of comparing surveyed data of a system line and a set line parameter before performing a system analysis simulation, detecting whether the line parameter is erroneous.

In accordance with a first exemplary embodiment of the present invention, there is provided a simulation apparatus, which includes a database configured to set a line parameter for a system line configuring a power system; a parameter error detector configured to compare surveyed data measured in the system line and the line parameter to detect an error of the line parameter; a system analysis simulator configured to perform a system analysis simulation based on the surveyed data and the line parameter; and a monitor configured to display an error detection result of the line parameter from the parameter error detector and a system analysis simulation result performed in the system analysis simulator.

In accordance with a second exemplary embodiment of the present invention, there is provided an operating method of a simulation apparatus, which includes receiving surveyed data measured in a system line; calculating a surveyed line parameter, based on the surveyed data; outputting a difference value between the surveyed line parameter and the line parameter; determining whether the difference value meets a set reference difference value; and allowing the system analysis simulator to perform a system analysis simulation with at least one of the measured data and the line parameter, according to a determined result.

According to a simulation apparatus and operating method thereof, a system analysis simulation is performed by calculating a surveyed line parameter with surveyed data measured in a system line from a SCADA (Supervisor Control And Data Acquisition) and comparing the surveyed line parameter and a set line parameter to determine whether the line parameter is erroneous, producing a more correct result.

BRIEF DESCRIPTION OF THE DRAWINGS

FIG. 2 is a flowchart illustrating an operating method of a simulation apparatus in accordance with the present invention.

DETAILED DESCRIPTION OF THE EMBODIMENTS

Figure 1:
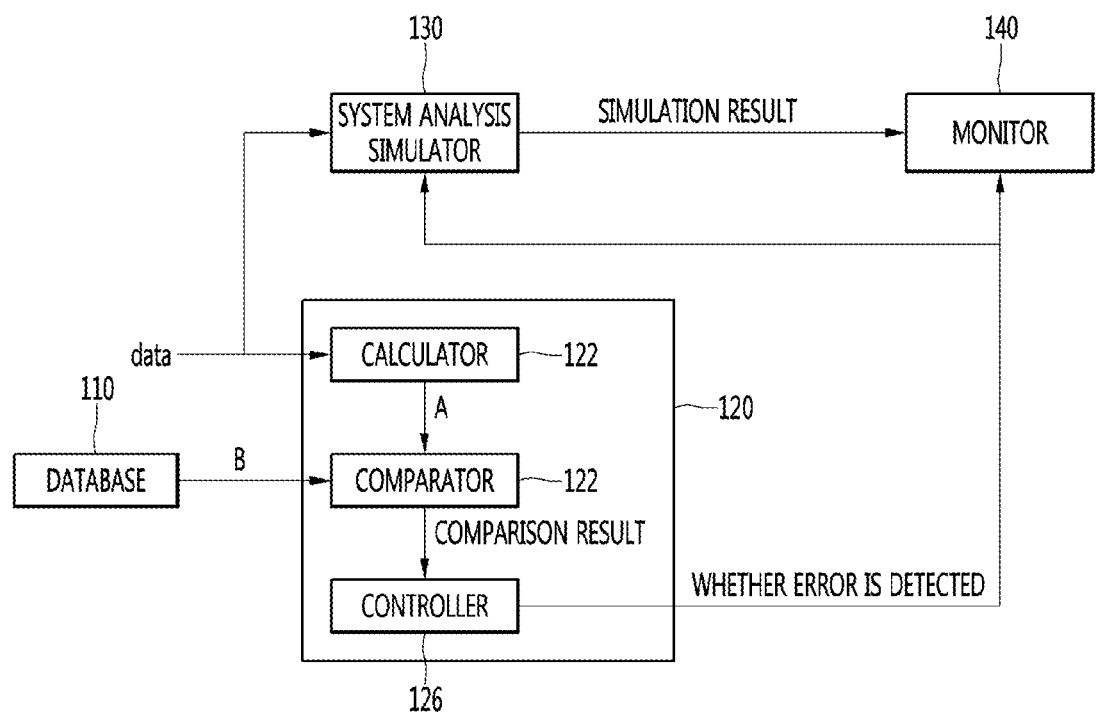
FIG. 1 is a control block diagram illustrating a simulation apparatus in accordance with the present invention.

Hereinafter, principles of the present invention are simply illustrated. Therefore, although not clearly described and illustrated in the specification, the principles of the present invention are embodied and various devices included ideas and scopes of the present invention are invented by those skilled in the art. Further, it should be understood that all conditional terms and embodiments listed in the specification are intended in principle only for the purpose of understanding ideas of the present invention, and are not limited to the embodiments and states that are specially listed above.

Further, it should be understood that all detailed descriptions listing a specific embodiment of the present invention as well as principles, perspectives and embodiments of the present invention are intended to include structural and functional equivalents of such matters. Further, it should be understood that those equivalents include all elements invented to perform the same function regardless of equivalents to be developed in the future as well as currently known equivalents, that is, structures.

FIG. 1 is a control block diagram illustrating a simulation apparatus in accordance with the present invention.

Referring to FIG. 1, the simulation apparatus may include a database 110, a parameter error detector 120, a system analysis simulator 130 and a monitor 140.

In an embodiment, the simulation apparatus may operate separately or linked to an energy management system (EMS), and may be included in the EMS, which is not limited thereto.

The database 110 may set and store a line parameter for a system line configuring a power system.

In the embodiment, the line parameter may be inputted by an operator or a manager through the monitor 140, or by a separate external device, which is not limited thereto.

The line parameter may include at least one of resistance, charging capacitance and rated capacitance of a line, and a generator parameter including internal resistance and output limit of a generator, which is not limited thereto.

While the database 110 is illustrated and described to be included in the simulation apparatus, it may be a separate server, which is not limited thereto.

The parameter error detector 120 may include a calculator 122, a comparator 124 and a controller 126.

When the calculator 122 receives the surveyed data measured in the system line from a SCADA, it may calculate a surveyed line parameter A of the system line based on the surveyed data.

Here, the surveyed data may include at least one of voltage, active power or reactive power, which is not limited thereto.

For example, it is described that surveyed data for a system line connecting first and second buses is inputted from the SCADA.

First, the calculator 122 may calculate the line parameter A based on the surveyed data using the equations below.

$$A = (Q_{consumption} + Q_{generated\ and\ measured\ value}) / \{(V_a + V_b)/2\}^2 \quad \text{[Equation 1]}$$

$$Q_{consumption} = [\{(P_a)^2 + (Q_a)^2\} / (V_a)^2] \times X \quad \text{[Equation 2]}$$

In the above described equations 1 and 2, A may denote a surveyed line parameter, Qconsumption may denote an reactive power generated by X component of the system line, Va may denote voltage of a first bus, Vb may denote voltage of a second bus, and Qgenerated and measured value may denote a measured value for an reactive power consumed by B component of the system line.

Here, the X component may be an arbitrary value, or a parameter value for a system load on a scenario, which is not limited thereto.

Here, $V_a$, $V_b$ and $Q_{generated\ and\ measured\ value}$ may be included in the surveyed data.

As such, the calculator 122 may calculate the surveyed line parameter A for the surveyed data, using the above described equations 1 and 2.

The comparator 124 may compare the surveyed line parameter A calculated in the calculator 122 and the line parameter B set and stored in the database 110, outputting a difference value for a compared result.

Here, the comparator 124 may make a comparison using the equation below.

$$Q_{generation} = \{(V_a + V_b)^2 / 4\} \times B$$

$$Q_{generation} = Q_{generated\ and\ calculated\ value} + Q_{consumption} \quad \text{[Equation 3]}$$

Here, Qgeneration may denote an reactive power consumed by the B component of the system line, Qconsumption may denote a consumption power, Qgenerated and calculated value may denote a consumption power calculated according to the B component of the system line, Va may denote voltage of a first bus, Vb may denote voltage of a second bus and B may denote a line parameter.

The comparator 124 may compare the line parameter B and the surveyed line parameter A to output a compared result as a difference value between the line parameter B and the surveyed line parameter A.

Then, the controller 126 may identify whether the difference value outputted from the comparator 124 meets a set reference difference value.

That is, the controller 126 may determine and detect the line parameter B to be erroneous when the difference value does not meet the reference difference value. Further, the controller 126 may control the detected error of the line parameter B to be displayed on the monitor 140 and correct the line parameter B into the surveyed line parameter A.

When the difference value meets the reference difference value, the controller 126 may determine the line parameter B to be normal, controlling the system analysis simulator 130 to perform a system analysis simulation with the surveyed data.

The system analysis simulator 130 may be controlled by the controller 126 to perform a system analysis simulation for a normal line parameter B, so that it may perform a system analysis simulation with the surveyed data.

Here, the system analysis simulator 130 may transfer a result of the system analysis simulation to the monitor 140 to be displayed thereon.

Further, when the line parameter A is detected as error by the controller 126, the system analysis simulator 130 may adjust the surveyed data according to the line parameter A, perform a system analysis simulation with the surveyed data adjusted, and transfer a result of the system analysis simulation to the monitor 140 to be displayed thereon.

The monitor 140 may display whether an error of the line parameter B is detected and a result of the system analysis simulation.

Further, the monitor 140 may display a screen to amend or correct the line parameter B according to an input of an operator or a manager, which is not limited thereto.

The simulation apparatus according to the present invention makes an error of the surveyed data or the line parameter A detected before the system analysis simulation is performed, so that a high reliability can be obtained for a result of the system analysis simulation.

FIG. 2 is a flowchart illustrating an operating method of a simulation apparatus in accordance with the present invention.

Referring to FIG. 2, a parameter error detector 120 of a simulation apparatus may receive surveyed data measured in a system line from a SCADA (S110), and calculate a surveyed line parameter A based on the surveyed data (S120).

That is, when the parameter error detector 120 receives the surveyed data measured in the system line from the SCADA, it may apply the surveyed data to the above described equations 1 and 2 to calculate the surveyed line parameter A of the system line.

Here, the surveyed data may include at least one of voltage, active power or reactive power, which is not limited thereto.

After the step S120, the parameter error detector 120 may output a difference value between the surveyed line parameter A and a line parameter B set in the database 110 (S130), and determine whether the difference value meets a set reference difference value (S140).

According to a determined result, the parameter error detector 120 may control a system analysis simulator 130 to perform a system analysis simulation with at least one of the surveyed data or the line parameter (S150).

That is, the system analysis simulator 130 may be controlled by the parameter error detector 120 to perform the system analysis simulation for a normal line parameter B, so that it may perform the system analysis simulation with the surveyed data.

Further, when the parameter error detector 120 detects that the line parameter B is erroneous, the system analysis simulator 130 may adjust the line parameter B according to the surveyed data, perform a system analysis simulation with the surveyed data, and transfer a result of the system analysis simulation to the monitor 140 to be displayed thereon.

After step S150, the system analysis simulator 130 may transmit the result of the system analysis simulation to the monitor 140 to be displayed thereon (S160).

After step S140, the parameter error detector 120 may transfer the determined result of whether the line parameter B is normal or erroneous to the monitor 140 to be displayed thereon (S170).

The monitor 140 may display a screen with which the line parameter B is corrected, and correct the line parameter B set in the database 110 when a correction command of the line parameter B is inputted by an operator or a manager (S180).

Although the present invention was illustrated and described with reference to preferred embodiments, it is not limited to a specific embodiment described above. The present invention may be changed and modified in various ways, without departing from the ideas and technical regions described in claims, by those skilled in the art. Further, such modified embodiments should not be inferred separately from the technical ideas or prospects of the present invention.

What is claimed is:

1. A simulation apparatus, comprising:
   a database configured to set a line parameter including at least one of resistance, charging capacitance, rated capacitance of a line for a system line including a power transmission facility configuring a power system;
   a parameter error detector configured to compare surveyed data measured in the system line and the line parameter to detect an error of the line parameter;
   a system analysis simulator configured to perform a system analysis simulation based on the surveyed data and the line parameter; and
   a monitor configured to display an error detection result of the line parameter from the parameter error detector and a system analysis simulation result performed in the system analysis simulator,
   wherein the parameter error detector includes:
      a calculator configured to calculate a surveyed line parameter based on the surveyed data,
      a comparator configured to compare the surveyed line parameter and the line parameter to output a difference value for a comparison result, and
      a controller configured to determine the line parameter to be erroneous and detect the line parameter when the difference value does not meet a reference difference value,
   wherein the surveyed data include at least one of voltage, active power, and reactive power measured in the system line,
   wherein the surveyed line parameter is calculated according to the following equation:

the surveyed line parameter=(reactive power generated by a first component of the system line+ reactive power consumed by a second component of the system line)/{(a voltage of a first bus+a voltage of a second bus)/2}$^2$.

2. The simulation apparatus of claim 1, wherein the controller determines the line parameter to be normal and detects the line parameter, when the difference value meets the reference difference value.

3. The simulation apparatus of claim 1, wherein the system analysis simulator performs the system analysis simulation based on the line parameter, when the parameter error detector determines the line parameter to be normal and detects the line parameter.

4. The simulation apparatus of claim 1, wherein the system analysis simulator performs the system analysis simulation based on the surveyed data, when the parameter error detector determines the line parameter to be erroneous and detects the line parameter.

5. The simulation apparatus of claim 1, wherein the line parameter further includes generator parameter having an internal resistance and an output limit of a generator.

6. An operating method of a simulation apparatus, the method comprising:
   setting a line parameter for a system line configuring a power system;
   receiving, by parameter error detector, surveyed data measured in the system line including a power transmission facility;
   calculating, by a calculator, a surveyed line parameter including at least one of resistance, charging capacitance, rated capacitance of a line, based on the surveyed data in the system line, which is inputted from a SCADA;
   outputting, by a comparator, a difference value between the surveyed line parameter and the line parameter;
   determining, by a controller, whether the difference value meets a set reference difference value; and
   performing, by a system analysis simulator, a system analysis simulation with at least one of the measured data or the line parameter, according to a determined result,
   wherein the surveyed line parameter is calculated according to the following equation:

the surveyed line parameter=(reactive power generated by a first component of the system line+ reactive power consumed by a second component of the system line)/{(a voltage of a first bus+a voltage of a second bus)/2}$^2$.

7. The method of claim 6, wherein, in performing the system analysis simulation, the line parameter is determined to be normal when the difference value meets the reference difference value, and the system analysis simulation is performed based on the line parameter.

8. The method of claim 6, wherein, in performing the system analysis simulation, the line parameter is determined to be erroneous when the difference value does not meet the reference difference value, and the system analysis simulation is performed with the surveyed data.

9. The method of claim 6, further comprising:
   displaying the line parameter as normal or erroneous according to a determined result.

10. The method of claim 9, further comprising, after displaying the line parameter as erroneous, correcting the line parameter set in a database of the simulation apparatus when a correction command of the line parameter is inputted.

* * * * *